United States Patent
Brunnecker et al.

(10) Patent No.: US 8,759,710 B2
(45) Date of Patent: Jun. 24, 2014

(54) PROCESS AND DEVICE FOR FORM LOCKED JOINING OF TWO COMPONENTS

(75) Inventors: Frank Brunnecker, Memmelsdorf (DE); Alexander Hofmann, Erlangen (DE)

(73) Assignee: LPKF Laser & Electronics AG, Garbsen (DE)

( * ) Notice: Subject to any disclaimer, the term of this patent is extended or adjusted under 35 U.S.C. 154(b) by 1097 days.

(21) Appl. No.: 11/747,588

(22) Filed: May 11, 2007

(65) Prior Publication Data

US 2007/0204954 A1 Sep. 6, 2007

(30) Foreign Application Priority Data

Nov. 21, 2005 (DE) .......................... 10 2005 000 160

(51) Int. Cl.
*B23K 26/00* (2014.01)

(52) U.S. Cl.
USPC ............... 219/121.63; 219/121.6; 219/121.64

(58) Field of Classification Search
USPC ........ 156/272.8, 275.7, 379.8; 219/57, 121.6, 219/121.63, 121.64
See application file for complete search history.

(56) References Cited

U.S. PATENT DOCUMENTS

| 5,334,191 | A | * | 8/1994 | Poppas et al. .................... 606/12 |
| 5,452,182 | A | * | 9/1995 | Eichelberger et al. ........ 361/749 |
| 6,596,122 | B1 | * | 7/2003 | Savitski et al. ............ 156/304.2 |
| 2005/0208361 | A1 | * | 9/2005 | Enjoji et al. .................... 429/36 |

FOREIGN PATENT DOCUMENTS

| DE | 102004004985 | | 8/2005 | |
| DE | 4215041 | C3 | 5/2007 | |
| GB | 2069391 | A * | 8/1981 | ............. B23P 17/00 |
| JP | 62064528 | A | 3/1987 | |

* cited by examiner

*Primary Examiner* — Henry Yuen
*Assistant Examiner* — Ayub Maye
(74) *Attorney, Agent, or Firm* — Browdy and Neimark, PLLC

(57) ABSTRACT

A process is described for form locking joining of two components through plastic deformation of one of the two components. In order for the tool for forming the form locking connection not to get in direct contact with the plasticized area of the joining partners, a third component between the tool and the two components to be joined through form locking is being used, which simultaneously enters into an adhesive bond with one of the two components to be joined through form locking. The thermal energy for creating the plastic state of one of the joining partners and for developing the adhesive bond is applied through electromagnetic radiation through the third component.

8 Claims, 2 Drawing Sheets

PROCESS AND DEVICE FOR FORM LOCKED JOINING OF TWO COMPONENTS

FIELD OF THE INVENTION

The invention relates to a process and a device for form locked joining of two components and to a device for performing the process.

BACKGROUND OF THE INVENTION

In many mechatronic systems, e.g. in automotive sensorics, there is a requirement to integrate printed circuit boards into a housing. Since the electronics have to interface via connectors or other sensoric interfaces with the system periphery, the printed circuit board has to be fixated in the surrounding housing in a defined position. For accomplishing this object, a multitude of solutions is available in the state of the art.

A possibility to establish disengageable connections is using threaded connections. The disadvantage of this process is that the housing then has to be provided with a thread. When using plastic housings, a threaded metal insert is therefore often integrated during the injection molding process in order to obtain a load bearing thread. Consequently, manufacturing a respective connection is very expensive.

Among the non disengageable connection techniques, e.g. encasing the printed circuit board in the housing or so-called hot caulking are being used. During hot caulking, a rod shaped component, briefly also called pin, is run through a hole in the printed circuit board, so that it rests on a shoulder. Subsequently, the pin protruding beyond the thickness of the printed circuit board is deformed under thermal energy, so that the pin forms a rivet head for form locked fixation of the printed circuit board. A respective process using ultrasound energy for generating the necessary heat is described in DE 4215041 C3 (Siemens AG). A similar process is disclosed in JP 62064528 A (Toyota Motor Corp.), in which radiation energy is used to achieve the plastic state of one of the joining partners. The hot caulking processes according to the state of the art, however, have the disadvantage that forming the rivet head is being performed through a contact tool. When using such processes for hot caulking of plastic housings or printed circuit boards, this bears the risk of material sticking to the shaping tool.

Besides mounting the printed circuit board in the housing, also the media tight closing of the housing is an important part of the value creation process of mechatronic systems. As a process which creates particularly high quality welded connections, laser through transmission welding is industrially established. In this process, two joining partners, which can be welded through melting, are being combined, one of which has a high degree of optical transmission for the wavelength of the welding laser that has been used, and however, the other joining partner strongly absorbs this wavelength. In an overlapping assembly of both joining partners, the welding radiation can transmit through the joining partner facing it and is subsequently absorbed at the contact surface of the two components. The absorbing joining partner is being heated until both joining partners are melted in their contact area through heat conduction. In order to facilitate heat conduction between the joining partners, these are loaded with a compressing force. Since the widely used plastic materials have low heat conductivity, the induced welding energy remains in the joining zone for a certain period of time, depending on how the process is performed, so that material, which is still soft, mostly from the absorbing joining partner can be displaced out of the joining plane under the influence of the compression force. Under continued application of a compression force, the joining partners thus can perform a relative motion towards each other, in order to compensate for possible gaps in the weld. A respective process is disclosed e.g. in DE 102004004985 A1 (Laserquipment AG). The process described therein, like other current processes for closing housings, does not provide for a possibility to mount the enclosed printed circuit board, so that separate precursory process steps are necessary, which is disadvantageous.

SUMMARY OF THE INVENTION

The object of the present invention is to provide a reliable and error tolerant process for form locking connection of two components, which does not have the disadvantages of the current state of the art processes. Furthermore, it is part of the object of the invention to perform the form locking connection of two components simultaneously with the adhesive bonding of a third component, in order to integrate two process steps, and to thereby achieve a cost saving shortening of the process chain.

In order to achieve the object, it is suggested according to the invention, to create the form locking connection between a first and a second component through plastic deformations of the first component by a third component. The third component, thereby, does not have to be in contact with the second component, it is rather being used to plastically deform the first component, so that a form locking connection between the first and the second component can occur. The third component preferably enters into an adhesive bond with the first component, while establishing the form locking connection between the first and the second component.

The invention is characterized in that the plastic deformation to achieve form locking is generated through a third component participating in the joining process, which by itself enters into an adhesive bond with one of the joining partners. A respective process is used e.g. for mounting printed circuit boards in a housing made from thermoplastic plastic material.

The advantage of this procedure is that the tool, imparting the force for the plastic deformation, is not in direct contact with the plasticized component, so that an unwanted material adhesion on the tool can be avoided. The invention thereby utilizes the state of the art trough transmission welding process, in order to create the adhesive bond between the first and the third respective component, each weldable through melting, preferably made from thermoplastic plastic material, and to provide the energy to transform the first component into a state, where it can be plastically deformed. Furthermore, the invention is characterized in that, the first and the third component perform a feed motion relative to each other under the influence of a compression force during the welding process, according to the explanations in the state of the art, and that this feed motion is being used in order to produce the plastic deformation of the first component necessary for the form locking connection of the first and second component.

PREFERRED EMBODIMENTS OF THE INVENTION

Figure 1:
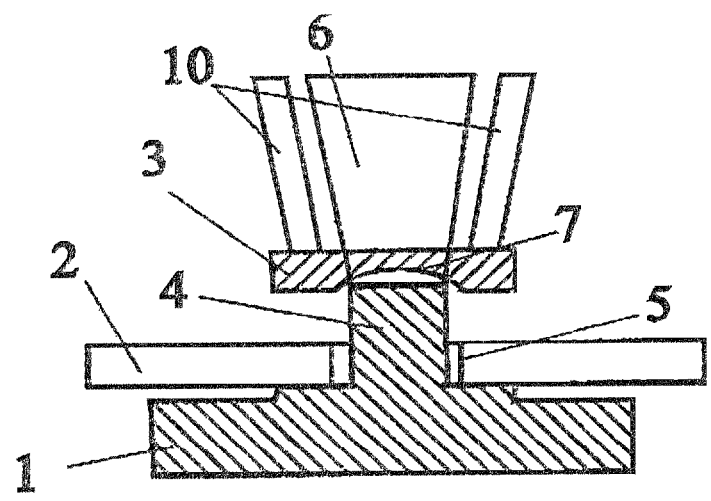
FIG. 1 is a schematic sectional view of a portion of three components to be connected to each other in a first process step according to a first embodiment of the invention.
Figure 2:
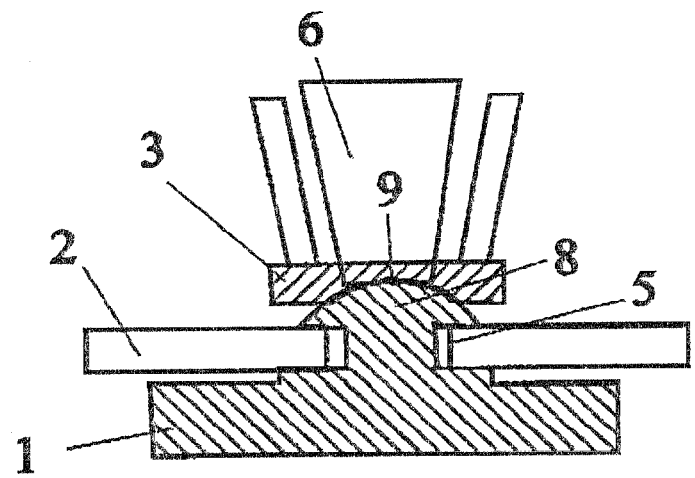
FIG. 2 is a schematic sectional view according to FIG. 1 in a second process step.

A first exemplary embodiment of the invention is illustrated in FIG. 1. The radiation absorbing joining partner (1) is depicted as a cutout, e.g. from an electronics housing. Through a pass-through hole (5) of the component (2) to be connected in a form locking manner, e.g. a printed circuit board, a column shaped riser (4), also called a pin, reaches through in the non joined state. An additional component (3) is placed onto this pin, initially in a loose manner, which is sufficiently transparent for the imparted welding radiation (6). The radiation transmitting component (3) has a concave cross section (7) in the contact area with the pin, which supports the creation of the material flow of the absorbing component (1) during the plastic deformation. The radiation transmitting component is pressed down onto the pin (4) through a down holder (10) mounted coaxial with the welding radiation. After the pin (4) has been exposed to the welding radiation (6) for a certain amount of time, and has been imparted with the compression force through the down holder (10), a plastic deformation of the pin (4) with a lateral material flow occurs, so that the assembly shown in FIG. 2 is created at the end of the process. During the joining process, material of the pin (4) is plasticized through the heating of the welding radiation, until it is displaced laterally under the influence of the compression force, so that cooler material layers of the pin are exposed again to the radiation and can be heated. Once the rate of material displacement is in equilibrium with the rate of plasticization through the welding radiation, the down holder element (10) can perform a constant feed motion in the direction of the absorbing joining partner (1). The concave indentation in the transmissive joining partner (7) supports the formation of the rivet head (8), necessary for the form locking connection, during the feed motion by determining the flow direction of the material. After a sufficient amount of material has been displaced for forming the rivet head, the joining partner (2) to be joined through form locking, is connected in a solid manner with the absorbing joining partner (1). Since the pin (4) is made from laser absorbing material, however, the initially loosely placed component (3) transmits the welding radiation (6), heat generation and adhesively bonded welding finally occurs at the contact surface of the two components.

Figure 3:
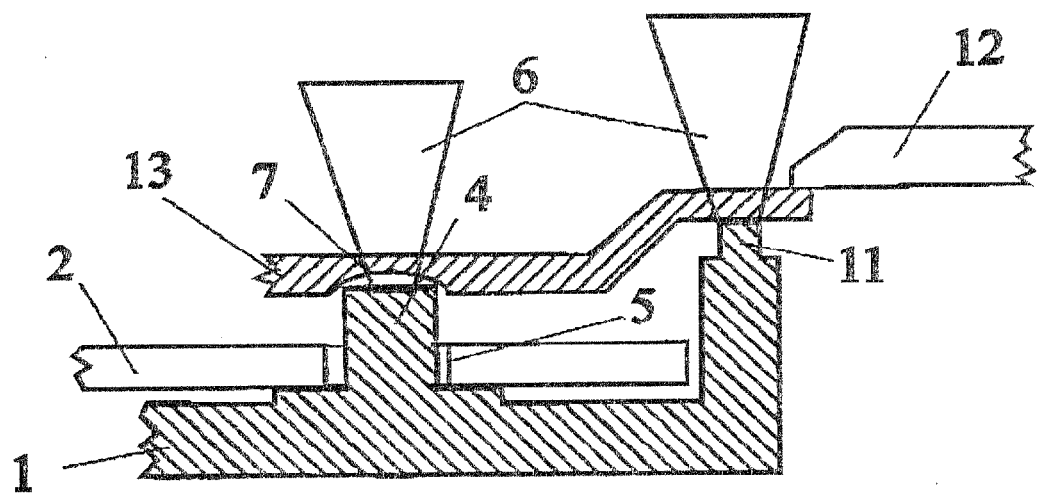
FIG. 3 is a schematic sectional view of three components to be connected to each other according to a second embodiment of the invention.

A particularly advantageous embodiment of the process according to the invention is shown in FIG. 3 before the joining process. Hereby, the transmissive component, which produces the plastic deformation of the pin (4), is a component of the complete assembly at the same time, which has further functions besides creating form locking. Thus in the sense of this functional integration, e.g. the cover of an electronics housing (13), which is supposed to close the housing tight against media, can simultaneously be used for forming the rivet head. Thereby, the radiation field of the welding radiation (6) is run along a welding bar (11), as described in the state of the art literature. The control means of the device for performing the process allow that, besides the welding bar (11), also the pin (4) is radiated within a short time interval from the radiation of the welding bar. Under the influence of the compression force, which is imparted along the circumferential welding rim with the assistance of a compression frame (12) onto the component cover (13) and the welding rim (11), according to the process described in the state of the art, a feed motion of the compression frame (12) and the housing cover (13) occurs in the direction of the radiation absorbing joining partner (1). Through the alternating irradiation of the welding rim (11) and the pin (4), a plasticization of the pin (4) occurs, which can then form the rivet head necessary for form locking through material displacement, as described in the above embodiment. Between the welding rim (11) and the housing cover (13), as well as between the pin and the housing cover (13), an adhesive bond occurs, while a form locking connection was created between the pin (4) as a component of the lower joining partner (1), and the printed circuit board (2). The adhesive bond between the pin (4) and the housing cover (13) increases the mechanical stiffness of the entire assembly, while the circumferential weld closes the housing tight against media. It is particularly advantageous in this embodiment of the invention, that the process of media tight welding is decoupled from the creation of the hot caulk with respect to the geometric tolerances of the components. If the third component (13) were directly used for form locking mounting of the printed circuit board (2), typical manufacturing tolerances of the components could cause the housing cover (13) to already make contact with the printed circuit board, before the welding rim (11) has been melted down by the desired height. On the other hand, the welding rim (11) and the pin (4) could already be melted down by a predetermined value, so that the entire joining process is terminated without the printed circuit board (2) being firmly pressed against the lower joining partner (1). The creation of form locking according to the invention through the displaced material of the pin (4) as a component of the lower joining partner, however, eliminates this problem.

REFERENCE NUMERALS 1 radiation absorbing joining partner
2 joining partner to be connected through form locking
3 radiation transmitting joining partner
4 pin
5 pass-through hole for pin
6 welding radiation cone
7 shape of rivet head in third joining partner
8 plastically deformed pin (rivet head)
9 area of adhesive bond joint
10 down holder tool (punctiform)
11 welding rim
12 down holder tool (shaped according to contour of seam)
13 housing cover

What is claimed is:
1. A process for joining together three components, comprising:
  positioning of a first component, a second component and a third component relative to each other, wherein the first component and the second component are to be joined through form locking,
  wherein the first component is made from a thermoplastic laser-absorptive material and includes a pin portion reaching the third component through a pass-through hole in the second component,
  the third component is made from a thermoplastic laser-transmissive material and the pin portion of the first component is in contact with the third component,
  welding the pin portion of the first component with the third component by a through transmission welding process, and
  plastically deforming the pin portion by simultaneously loading the third component with a joining force during the through transmission welding process, wherein, through a feed motion of the third component relative to the first component during the through transmission welding process, material is displaced from plastically deformable areas of the pin portion of the first component, so that the displaced material creates a form locking rivet connection between the first component and the second component.

2. The process according to claim 1, wherein during the welding of the first component and the third component, resultant plastic deformation does not create form locking between the second component and the third component.

3. The process according to claim 1, wherein the first component is an electronics housing, and the third component is a cover for this housing.

4. The process according to claim 1, wherein the second component is a printed circuit board.

5. The process according to claim 1, wherein a radiation used for plasticizing and welding the components is a laser radiation in a range of near infrared wavelength.

6. The process according to claim 1, wherein a radiation, which is used for plasticizing and welding the first component, the second component and the third component, is a polychromatic radiation, generated by a halogen lamp or short arc lamp.

7. A process for joining together three components, comprising:

positioning first component, second component and third components relative to each other so that the first and third components can be welded together with the second component therebetween, wherein the first component comprises a thermoplastic laser-absorptive material and includes a pin portion, wherein the third component comprises a thermoplastic laser-transmissive material, wherein the pin portion of the first component extends through a pass-though opening in the second component and contacts the third component, welding the pin portion of the first component to the third component by through transmission welding, simultaneously loading and plastically deforming the pin portion of the third component with a joining force during the through transmission welding, and thus displacing material from a plastically deformable area of the pin portion of the first component to create a rivet portion of the first component to form lock the second component to the first component.

8. A process for joining together three components, comprising:

positioning of a first component, a second component and a third component relative to each other, wherein the first component and the second component are to be joined through form locking, wherein the second component is a printed circuit board with a pass-through hole therethrough, wherein the first component is an electronic housing and is made from a thermoplastic laser-absorptive material and includes a pin portion reaching the third component through said pass-through hole in the printed circuit board, the third component is a cover for said housing and is made from a thermoplastic laser-transmissive material and the pin portion of the first component is in contact with the third component, welding the pin portion of the first component with the third component by a through transmission welding process, and plastically deforming the pin portion by simultaneously loading the third component with a joining force during the through transmission welding process, wherein, through a feed motion of the third component relative to the first component during the through transmission welding process, material is displaced from plastically deformable areas of the pin portion of the first component, so that the displaced material creates a form locking rivet connection between the first component and the second component.

* * * * *